US012117481B2

(12) United States Patent
Amidi

(10) Patent No.: US 12,117,481 B2
(45) Date of Patent: Oct. 15, 2024

(54) AUTONOMOUS DETECTION OF MEMORY INSERTION INTO TEST EQUIPMENT WITHOUT REQUIRING POWER TO THE TESTER UNIT

(71) Applicant: Intelligent Memory Limited, Kwai Chung (HK)

(72) Inventor: Mike Hossein Amidi, Lake Forest, CA (US)

(73) Assignee: Intelligent Memory Limited, Kwai Chung (HK)

( * ) Notice: Subject to any disclaimer, the term of this patent is extended or adjusted under 35 U.S.C. 154(b) by 27 days.

(21) Appl. No.: 18/089,516

(22) Filed: Dec. 27, 2022

(65) Prior Publication Data

US 2024/0210464 A1    Jun. 27, 2024

(51) Int. Cl.
*G01R 31/28* (2006.01)

(52) U.S. Cl.
CPC ..... *G01R 31/2808* (2013.01); *G01R 31/2844* (2013.01)

(58) Field of Classification Search
CPC .. G01R 22/066; G01R 19/00; G01R 31/2886; G01R 22/065; G01R 31/67; G01R 31/389; G01R 31/2851; G01R 31/31926; G01R 31/2867; G01R 19/165; G01R 1/0483; G01R 31/2863; G01R 1/07378; G01R 31/31903; G01R 31/66; G01R 32/2808; G01R 31/2844; G11B 27/34
See application file for complete search history.

(56) References Cited

U.S. PATENT DOCUMENTS

| | | | | |
|---|---|---|---|---|
| 5,793,218 | A * | 8/1998 | Oster | G01R 31/2844 324/754.11 |
| 8,150,046 | B2 * | 4/2012 | Hansson | H04R 1/1033 381/394 |
| 9,103,866 | B2 * | 8/2015 | Mehrabi | H04R 5/04 |
| 9,552,318 | B2 * | 1/2017 | Shin | G11C 16/14 |
| 9,612,260 | B2 * | 4/2017 | Olivier | G01R 1/0408 |
| 9,723,408 | B2 * | 8/2017 | Park | H04R 5/04 |
| 11,362,467 | B2 * | 6/2022 | Bowlerwell | H01R 24/58 |
| 2016/0069931 | A1 | 3/2016 | Olivier et al. | |
| 2024/0160544 | A1 * | 5/2024 | Amidi | G11C 29/56016 |

* cited by examiner

*Primary Examiner* — Vinh P Nguyen

(74) *Attorney, Agent, or Firm* — Fish IP Law, LLP

(57) ABSTRACT

Apparatus, systems, and methods for reducing memory product testing failures, including a memory tester that keeps track of how often a memory product is inserted into a memory product receiving component of the memory tester, and uses that information to trigger replacing the memory product receiving component when the count reaches or exceeds a threshold. The electronics can be arranged to increase the count even if a memory product is inserted into the memory product receiving component while the memory tester is powered off.

10 Claims, 5 Drawing Sheets

Figure 1 – Prior Art Volatile Memory Device Tester

Figure 2 – Prior Art Non-volatile Memory Device Tester

Figure 3 – Prior Art Volatile Memory DIMM Tester

Figure 4 – Prior Art Non-volatile Memory Module Tester

AUTONOMOUS DETECTION OF MEMORY INSERTION INTO TEST EQUIPMENT WITHOUT REQUIRING POWER TO THE TESTER UNIT

BACKGROUND OF THE INVENTION

The following description includes information that may be useful in understanding the present invention. It is not an admission that any of the information provided herein is prior art or relevant to the presently claimed invention, or that any publication specifically or implicitly referenced is prior art.

Computer systems utilize volatile and non-volatile memories to store and retrieve data. Volatile memories are used to store and retrieve data for shorter durations, and as temporarily storage, and retain data only as long as the power is not removed. Once the power is turned off volatile memories losses their data. On the other hand, non-volatile memories are used to store and retrieve data for longer durations, and as permanent storage, and will retain its data even after power gets turned off.

The main objective of storing and retrieving data into volatile memories is for quicker access time compared to traditional hard drive (HDD) or Solid State Drives (SSD) devices. In general, volatile memories access time is at least one magnitude faster than traditional HDD or SSD devices. The main objective of storing and retrieving data into non-volatile memories is to facilitate access after power cycling, or to allow other computer systems to access the same data.

Due to ongoing demand for higher speeds, the majority of computer systems currently utilize a large amount of volatile memories to temporarily store data, as well as a large amount of non-volatile memories to store and retrieve data for longer period of time such as seconds, minutes, hours, days, months, or even years.

For a computer system to provide a robust, solid, secure, and deterministic operation, it must utilize one or more volatile and or non-volatile memory products that are reliable, robust, and operational. To ensure those qualitied, a manufacturer of computer systems or their suppliers must utilize a successful, reliable, and solid testing environment that tests each individual volatile and non-volatile memory component.

Volatile and non-volatile memories can be assembled from individual dies from semiconductor wafers fabricated by specific lithography processes. In general, these wafers and their dies are tested for proper electrical operational, and functionality based on individual specifications for their voltages (DC levels) and timing (AC level) parameters. Once one or more good known dies are identified within a wafer, then these dies are then taken through a packaging process.

Packaging can involve one or more dies. For example, single die components are known as monolithic components, while semiconductor companies also commonly produce packages with dual, quad, and octal dies, as well as even higher combinations.

As used herein the term "memory products" includes both memory modules comprising one or more sub-systems of volatile and/or non-volatile memory packages, and also all devices that include memory packages. These products are then placed into computing systems to provide the volatile and or non-volatile memory capacity.

In view of the complexity of modern memory packages, there is a need for robust testing of individual volatile and non-volatile packages. Many companies provide generic semiconductor testing equipment that utilizes custom application specific integrated circuit (ASIC) or Field programmable Gate Array (FPGA) to build their tester products. These testers are designed and fine-tuned to perform AC and DC level tests for specific products, voltage, frequency, and temperatures. In general, these testers can either do only volatile memory testing or do only non-volatile memory testing. These testers are also designed to operate using fixed functional test patterns, to test against existing industry standards.

Additional information regarding memory testing devices can be found in U.S. patent application Ser. No. 17/985,037, filed Nov. 10, 2022, the disclosure of which is incorporated by reference herein in its entirety. Where a definition or use of a term in that reference is inconsistent or contrary to the definition of that term provided herein, the definition or use of that term provided herein is deemed to be controlling.

Following installation into a fully assembled system or sub-systems, a customer then tests the memory products against its own series of software application for system level verification. Whether installed in Printed Circuit Board (PCB) modules or elsewhere, there is a high downstream cost of having installed defective memory products, and accordingly it is extremely important that the tester equipment is highly reliable, and produces accurate test results for the life of the tester.

In general, an important component for proper testing of volatile and non-volatile memory devices, packages, or modules in any volatile and non-volatile memory tester is the package testing socket or PCB board level socket. The package testing socket is where the volatile and non-volatile memory packages get inserted into for proper testing, and the PCB board level socket is where volatile and non-volatile memory modules PCB gets plugged in for proper testing.

Because the mechanical pins get stressed during insertion and ejection, both package testing sockets and PCB board level sockets have finite useful lives. Therefore, there exists a demand for apparatus, systems, and methods to detect numbers of insertions of package testing sockets or PCB board level sockets.

One possibility is to use a simple firmware (FW) or software process, in conjunction with a microcontroller, finite state machine (FSM) or microprocessor, to detect insertions and ejections while a tester is powered on. But that solution would provide no means for detecting insertions and ejections while the tester is powered off.

What is needed are apparatus, systems, and methods for autonomously detecting insertion or ejection of volatile and non-volatile memory testing devices without a tester power being on.

SUMMARY OF THE INVENTION

The inventive subject matter provides apparatus, systems, and methods for autonomous detection of insertions and/or ejections of memory device packages or modules, without the tester device necessarily being powered on.

The general concept is to keep track of number of insertions of memory products into the memory product receiving component of a memory testing device, and then trigger replacement of the memory product receiving component when a threshold number of insertions is reached or exceeded.

In preferred embodiments of this invention an autonomous self-detection circuit uses a single pole single throw (SPST) switch to change the self-detection status from either normally closed (NC) to normally open (NO) or from NO to NC status. The pin or pins used to perform this detection can be ground (GND or VSS) pin to pull the detection circuit of the tester device to ground logical levels. When the circuit detects a ground signal into its input of select pin, the circuit will switch from either NO to NC or from NC to NO position, and hence will detect a memory module being inserted into the socket without any power being on in the tester device.

Contemplated detection circuits can be analog, digital, or combined analog/digital. Also contemplated are finite state machine (FSM) circuits, microcontroller circuits, microprocessor circuits. and Application Specific Integrated Circuit (ASIC) circuits, and Field Programmable Gate Array (FPGA) circuits.

DETAILED DESCRIPTION

Figure 1:
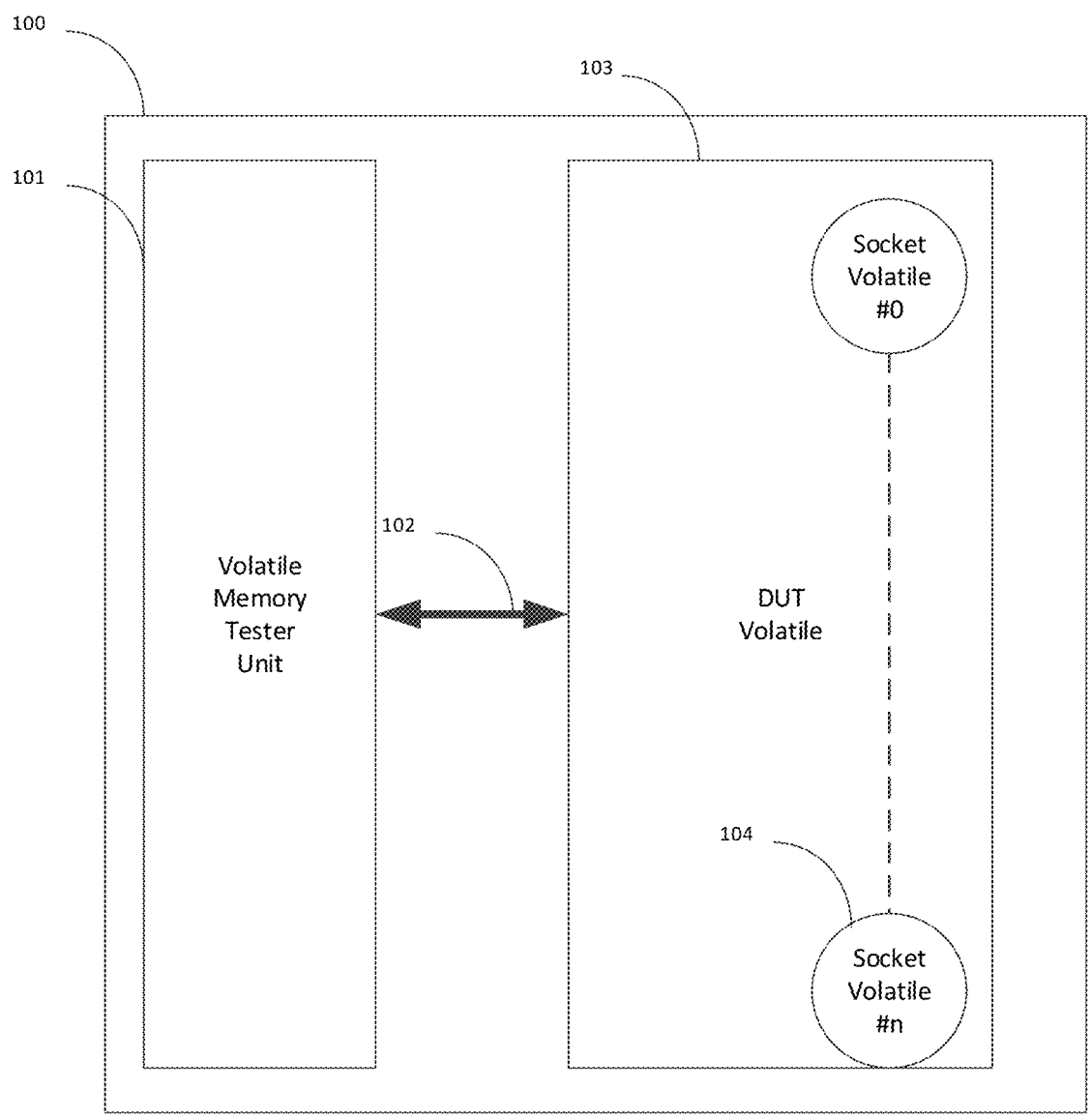
FIG. 1—Prior Art volatile Memory Device Tester
FIG. 2—Prior Art non-volatile Memory Device Tester
FIG. 3—Prior Art volatile Memory DIMM Tester
FIG. 4—Prior Art non-volatile Memory Module Tester
FIG. 5—Current Invention Powerless Device or Module Detection Circuitry

FIG. 1 shows a prior art volatile memory device tester 100 generally comprising volatile memory tester device 101 coupled via data path 102 to Device Under Test (DUT) platform 103. Platform 103 includes one or more sockets 104 configured to receive volatile memory devices (not shown). Volatile memory device tester 100 allows an end user to plug one or more volatile memory devices into platform 103 to perform standard off the shelf parametric testing.

Figure 2:
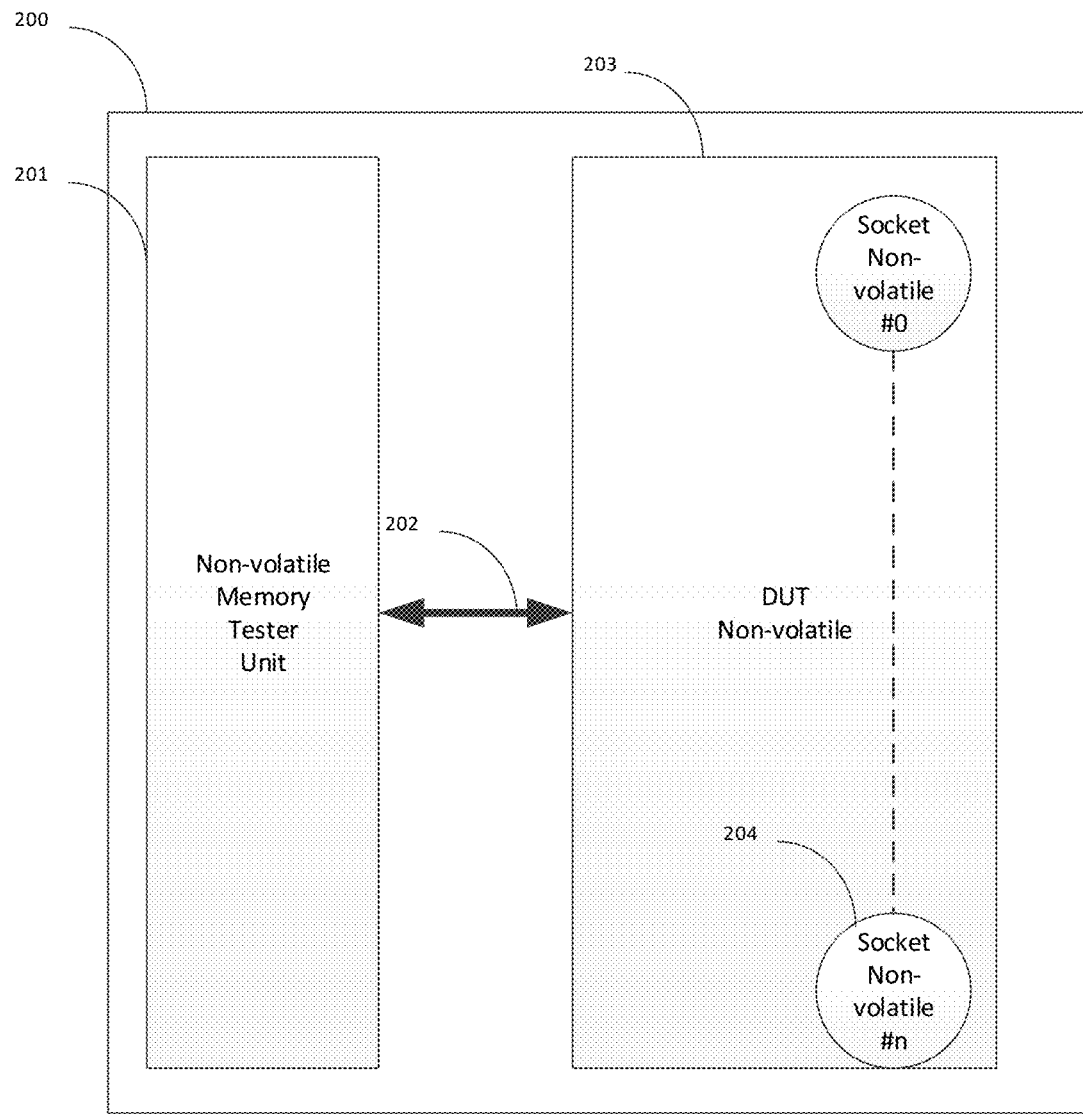

FIG. 2 shows a prior art non-volatile memory device tester 200 generally comprising non-volatile memory tester device 201 coupled via data path 202 to Device Under Test (DUT) platform 203. Platform 203 includes one or more sockets 204 configured to receive non-volatile memory devices (not shown). Non-volatile memory device tester 200 allows an end user to plug one or more non-volatile memory devices into platform 203 to perform standard off the shelf parametric testing.

Figure 3:
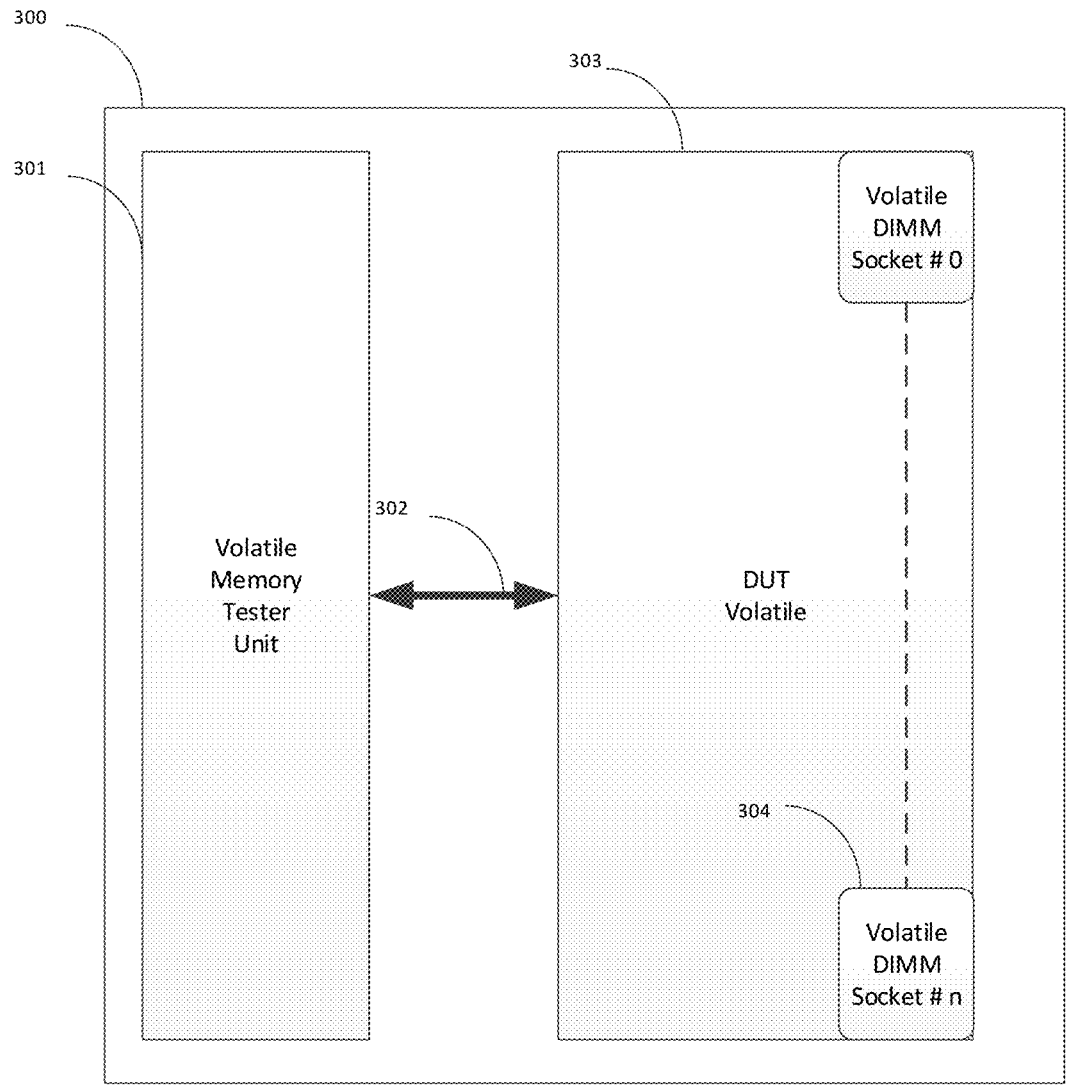

FIG. 3 shows a prior art volatile memory dimm tester 300 generally comprising volatile memory tester device 301 coupled via data path 302 to Device Under Test (DUT) platform 303. Platform 303 includes one or more volatile dimm sockets 304 configured to receive volatile memory devices (not shown). Volatile memory dimm tester 300 allows an end user to plug one or more volatile memory devices into platform 303 to perform standard off the shelf parametric testing.

Figure 4:
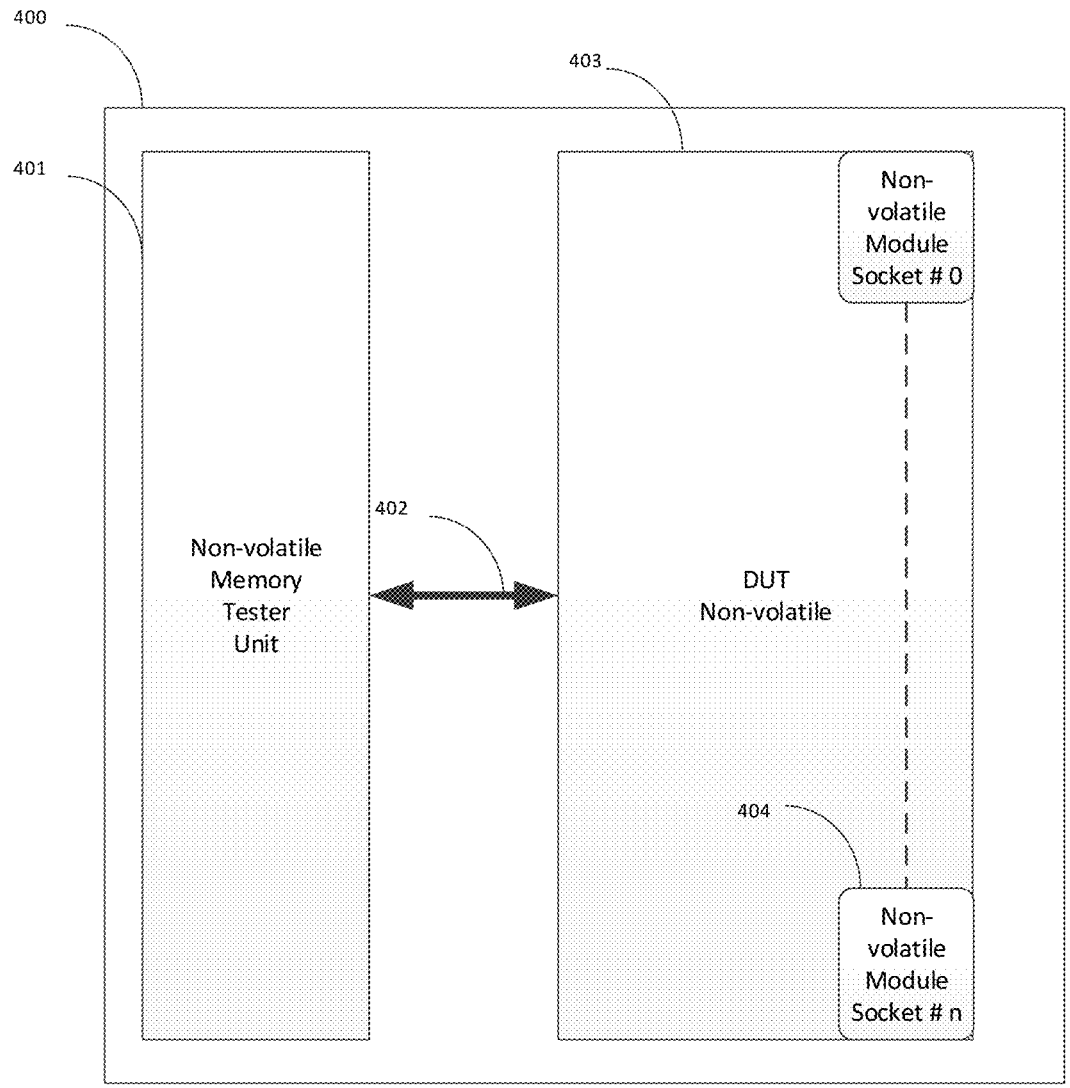

FIG. 4 shows a prior art non-volatile memory dimm tester 300 generally comprising non-volatile memory tester device 301 coupled via data path 302 to Device Under Test (DUT) platform 303. Platform 303 includes one or more non-volatile dimm sockets 304 configured to receive non-volatile memory devices (not shown). non-volatile memory dimm tester 300 allows an end user to plug one or more non-volatile memory devices into platform 303 to perform standard off the shelf parametric testing.

Figure 5:
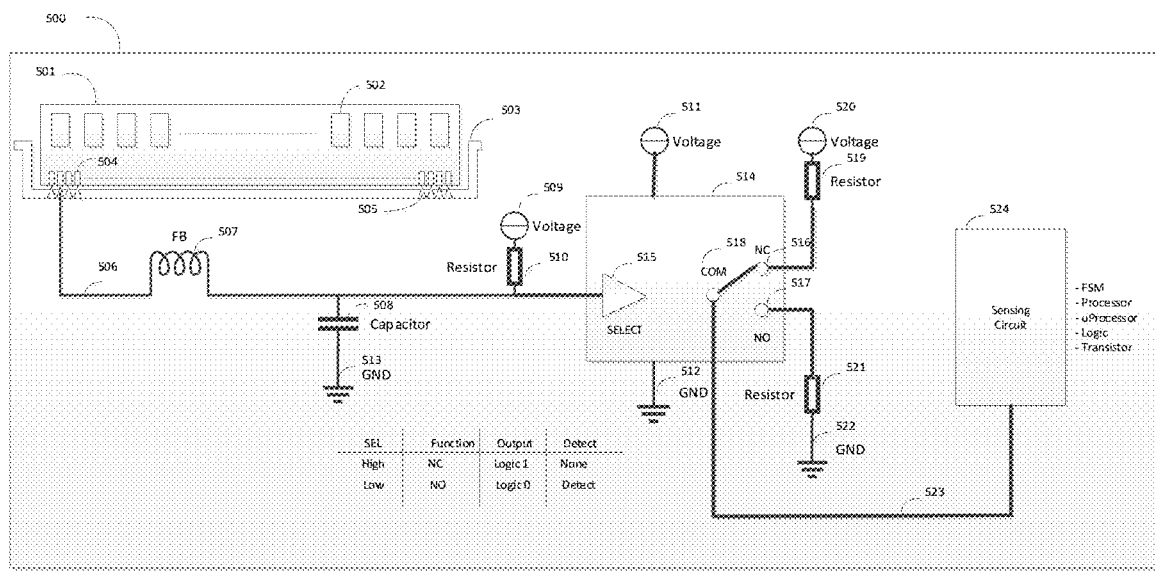

FIG. 5 shows a preferred embodiment of a tester device 500, configured to detect insertion or ejection of volatile and/or non-volatile memory modules without requiring any external power. Tester device 500 generally includes a memory product receiving component 503, a switch 514, various voltage sources 509, 511, and 520, and a sensing circuit 524.

Memory product receiving component 503 is configured to receive a memory product 501, which can include volatile or non-volatile memory modules and packages 502, and one or more electrical and signal coupling pins 504, 505. Memory product receiving component 503 is configured to carry signals from signal coupling pins 504, 505 to the remainder of the testing circuit.

Signal line 506 couples one or more of the signal coupling pins 504, 505 to noise isolation filter 507, which can advantageously comprise a Ferrite Bead. Output of filter 507 is coupled to capacitor 508 and ground GND 513, resistor 510, and voltage supply 509. This combination provides a slow pull-up circuit for input to signal selector 515 regardless of whether or not Signal line 506 is coupled to any volatile or non-volatile memory modules via memory product receiving component 503. The above-described arrangement also ensures detection circuit logical level from detection circuit power up, even if a memory product 501 is inserted into the memory product receiving component 503 during power off.

Switch 514 generally comprises signal selector 515 which is an input pin, and Normally Close Pin (NC) 516, Normally Open (NO) pin 517 and Common (COM) pin 518 which are all output pins. By default in this embodiment, COM pin 518 is default coupled to NC pin 516, and will toggle to connects to NO pin 517 if and only if the signal selector 515 logic level changes from its default state. Switch 514 also has power coupling into voltage supply 511 and ground coupling 512.

The NC pin 516 is coupled to resistor 519, which is coupled to voltage supply 520. The NO pin 517 is coupled to resistor 521, which is coupled to ground GND 522. This arrangement provides permanent Logic High for NC pin 516 through its coupling to resistor 519 and voltage supply 520. The NO pin 517 coupling provides permanent Logic Low for pin NO pin 517 through its coupling to resistor 521 and ground GND 522. The COM pin 518 is by default coupled to NC pin 516, and hence will provide a Logic High level via signal line 523 into sensing circuit 524.

The Sensing Circuit 524 is configured to detect non-insertion of memory product 501 into memory product receiving component 503 when Switch 514 input Select 515 pin is at Logic High level, since this will put the Switch 514 COM port 518 connected to NC pin 516 to Logic High level via Resistor 519 and Voltage Supply 520. Additionally, Sensing Circuit 524 is configured to detect insertion of memory product 501 into memory product receiving component 503 when Switch 514 input Select 515 pin is at Logic Low level, since this will put the Switch 514 COM port 518 connected to NO pin 517 to Logic Low level via Resistor 521 and GND 522 as shown in logic Table 1 below.

| SEL | Function | Output | Detect |
| --- | --- | --- | --- |
| High | NC | Logic 1 | None |
| Low | NO | Logic 0 | Detect |

The signal selector 515 is configured such that COM pin 518 toggles from the NC pin 516 to the NO pin 517 if and only if the signal selector 515 logic level changes from Logic High to Logic Low, which requires a volatile or non-volatile memory module to be plugged into any of the sockets 502, or the memory product 501 to be plugged into product receiving component 503. This pulls the voltage supply 509, resistor 510, capacitor 508 current and voltage levels into memory product 501, which toggles signal selector 515 logic from Logic High into Logic Low, and COM pin 518 to toggle from NC pin 516 Logic High to NO pin 517 Logic Low, and forces signal line 523 to toggle to Logic Low.

Sensing circuit 524 comprises a counter (not shown) to keep track of how many times the toggling has taken place, and correspondingly how many times a memory product 501 is inserted into memory product receiving component 503. This helps sensing circuit 524 track usage of memory product receiving component 503 relative to its maximum lifetime insertion specification or other threshold, which can be defined by the manufacturer of memory product receiving component 503. When the sensing circuit 524 detects that the number of insertions of memory product 501 into memory product receiving component 503 has reached a threshold for this tester, it triggers the tester operator (not shown here for simplicity) that it is time to change the memory product receiving component 503, due to having reached a projected coupling socket end-of-life. In a further step, the testing operator then uses that information to replace the then-current product receiving component 503 with a replacement memory product receiving component.

As used herein, the term memory product receiving component is used generically to mean whatever component memory products are repeatedly inserted into, and removed from, for testing by a memory tester, even if that memory product receiving component is not considered part of the memory tester per se. Thus, for example, if one were to interpose an intermediate memory product receiving component between the memory products and the memory product receiving component 503 of the memory tester of FIG. 5, then that interposed component would be considered to be a memory product receiving component of a memory testing apparatus.

Taken together, this apparatus, system, and method is configured to reduce memory product testing failures associated with coupling socket end-of-life issues.

In FIG. 5, sensing circuit 524 should be interpreted as representing any of a Finite State Machine (FSM), a processor, a microprocessor, a pure digital logic, or even an analog transistor circuit. The entire mechanism provides an autonomous powerless circuit to detect volatile or non-volatile memory module insertion or ejection. It is important to note, however, that in alternative embodiments, one or more of the components could be powered.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the disclosed embodiments. Thus, for example, in any method or process disclosed herein, the acts or operations making up the method/process may be performed in any suitable sequence and are not necessarily limited to any disclosed sequence.

Various aspects and advantages of the embodiments have been described where appropriate. It is to be understood that not necessarily all such aspects or advantages may be achieved in accordance with any embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A memory testing apparatus, comprising:
 a memory product receiving component having a socket array comprising a signal coupling pin configured to receive a pin of a memory product;
 a switch configured to change from a normally closed (NC) to a normally open (NO) status or from the NO to the NC status, as a function of a change in voltage between the signal coupling pin and a ground, occasioned by coupling of the memory product into, or ejection of the memory product from, the memory product receiving component; and
 a sensing circuit configured to detect a status change in the switch;
 wherein the switch is coupled to an electric power source; and
 wherein the memory product is configured to function without relying on an-the electric power source.

2. The memory testing apparatus of claim 1, wherein the socket array is configured to receive the pin of the memory product that can be either a volatile or a non-volatile memory product.

3. The memory testing apparatus of claim 1, wherein the sensing circuit is configured to track usage of the memory product receiving component relative to an established threshold.

4. The memory testing apparatus of claim 3, wherein the sensing circuit comprises a Finite State Machine (FSM).

5. The memory testing apparatus of claim 3, wherein the sensing circuit comprises a processor.

6. The memory testing apparatus of claim 5, wherein the processor comprises a microprocessor.

7. The memory testing apparatus of claim 3, wherein the sensing circuit comprises a pure digital logic circuit.

8. The memory testing apparatus of claim 3, wherein the sensing circuit comprises an analog transistor circuit.

9. A method of reducing memory product testing failures, comprising:
 counting, by a memory tester, a number of insertions or ejections of one or more memory products into a memory product receiving component of the memory tester; and
 using the count to trigger replacing the memory product receiving component when the count reaches or exceeds a threshold.

10. The method of claim 9, wherein the counting occurs while the memory tester is powered off.

* * * * *